United States Patent
Park et al.

(10) Patent No.: US 7,525,337 B2
(45) Date of Patent: Apr. 28, 2009

(54) ON-DIE TERMINATION CIRCUIT AND METHOD FOR SEMICONDUCTOR MEMORY APPARATUS

(75) Inventors: Jung-Hoon Park, Gyeonggi-do (KR); Sun-Suk Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 7 days.

(21) Appl. No.: 11/602,284

(22) Filed: Nov. 21, 2006

(65) Prior Publication Data

US 2007/0146004 A1 Jun. 28, 2007

(30) Foreign Application Priority Data

Dec. 27, 2005 (KR) ............. 10-2005-0130344
Dec. 27, 2005 (KR) ............. 10-2005-0130345

(51) Int. Cl.
H03K 17/16 (2006.01)
H03K 19/003 (2006.01)

(52) U.S. Cl. ........................................ 326/30
(58) Field of Classification Search ............. 326/30
See application file for complete search history.

(56) References Cited

U.S. PATENT DOCUMENTS

| | | | | |
|---|---|---|---|---|
| 6,064,224 | A * | 5/2000 | Esch et al. ............ | 326/30 |
| 6,118,310 | A * | 9/2000 | Esch, Jr. ............... | 327/108 |
| 6,300,821 | B1 * | 10/2001 | Nakano ................ | 327/538 |
| 6,307,424 | B1 * | 10/2001 | Lee ...................... | 327/530 |
| 6,710,618 | B1 | 3/2004 | Murray | |
| 6,809,546 | B2 | 10/2004 | Song et al. | |
| 6,833,729 | B2 * | 12/2004 | Kim et al. ............ | 326/30 |
| 6,839,143 | B2 * | 1/2005 | Otto .................... | 356/512 |
| 6,928,007 | B2 | 8/2005 | Jin | |
| 6,937,055 | B2 * | 8/2005 | Roy et al. ............ | 326/30 |
| 6,958,613 | B2 | 10/2005 | Braun et al. | |
| 7,148,720 | B2 * | 12/2006 | Chen .................... | 326/30 |
| 2004/0008054 | A1 * | 1/2004 | Lesea et al. ......... | 326/30 |

(Continued)

FOREIGN PATENT DOCUMENTS

JP       2004310981       11/2004

(Continued)

*Primary Examiner*—Rexford barnie
*Assistant Examiner*—Jason Crawford
(74) *Attorney, Agent, or Firm*—Venable LLP; Jeffri A. Kaminski (57) ABSTRACT

An on-die termination circuit for semiconductor memory apparatus includes an ODT (On Die Termination) input driving unit that divides an input voltage on the basis of a resistance ratio according to a first code Pcode<0:N> having at least two bits and outputs a first line voltage, a first ODT control unit that counts the first code or resets the first code to a first set value according to whether or not the first line voltage and a reference voltage match with each other, an ODT output driving unit that divides an input voltage on the basis of the resistance ratio according to the first code and a resistance ratio according to a second code having at least two bits and outputs a second line voltage, and a second ODT control unit that counts the second code or resets the second code to a second set value according to whether or not the second line voltage and the reference voltage are consistent with each other.

24 Claims, 7 Drawing Sheets

U.S. PATENT DOCUMENTS

| | | |
|---|---|---|
| 2005/0040845 A1* | 2/2005 | Park .......................... 326/30 |
| 2005/0226080 A1 | 10/2005 | Lee |
| 2005/0242832 A1 | 11/2005 | Shin |
| 2005/0253615 A1 | 11/2005 | Sunwoo et al. |
| 2006/0006903 A1* | 1/2006 | Choi et al. .................. 326/30 |

FOREIGN PATENT DOCUMENTS

JP     2005228458     8/2005

* cited by examiner

Fig. 1

Related Art

ON-DIE TERMINATION CIRCUIT AND METHOD FOR SEMICONDUCTOR MEMORY APPARATUS

BACKGROUND OF THE INVENTION

1. Technical Field

The present invention relates to a semiconductor memory apparatus, and in particular, to an on-die termination circuit and an on-die termination method for a semiconductor memory apparatus.

2. Related Art

In general, when a signal to be transmitted through a bus line having a predetermined impedance meets another bus line having a different impedance, a portion of the signal is lost. Accordingly, an on-die termination (hereinafter, referred to as "ODT") technique is used to match the impedance of the two bus lines with each other, to thereby reduce the signal loss.

Figure 1:
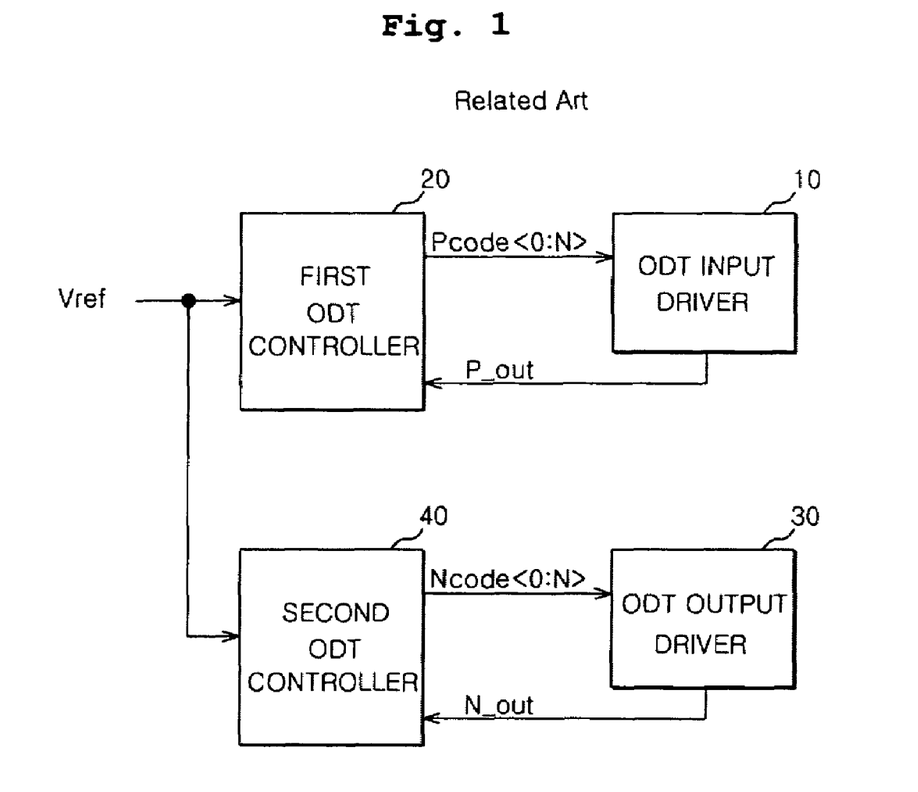
FIG. 1 is a block diagram showing the configuration of an on-die termination circuit for a semiconductor memory apparatus according to the related art.

As shown in FIG. 1, an on-die termination circuit according to the related art includes an ODT input driver 10 that is modeled like a data input driver, which divides a power supply voltage VDDQ on the basis of a resistance ratio according to a first code Pcode<0:N>, and outputs a first line voltage P_out, a first ODT controller 20 that compares the first line voltage P_out and a reference voltage Vref and counts the first code Pcode<0:N> according to the comparison result, an ODT output driver 30 that is modeled like a data output driver, that divides the power supply voltage VDDQ on the basis of a resistance ratio according to a second code Ncode<0:N>, and outputs a second line voltage N_out, and a second ODT controller 40 that compares the second line voltage N_out and the reference voltage Vref and counts the second code Ncode<0:N> according to the comparison result.

Upon initial operation, the ODT input driver 10 outputs the first line voltage P_out according to an initial value of the first code Pcode<0:N>.

Next, the first ODT controller 20 compares the first line voltage P_out and the reference voltage Vref and performs an up or down-count of the first code Pcode<0:N> according to the comparison result.

At this time, the ODT input driver 10 receives the counted first code Pcode<0:N> and feeds back the first line voltage P_out according to the counted first code Pcode<0:N> to the first ODT controller 20. Then, the comparison operation of the first ODT controller 20 and the output operation of the first line voltage P_out of the ODT input driver 10 are repeated.

If the first line voltage P_out and the reference voltage Vref are consistent with each other, the first code Pcode<0:N> count operation of the first ODT controller 20 stops, and the ODT operation is completed.

The operations of the ODT output driver 30 and the second ODT controller 40 are the same as those of the ODT input driver 10 and the first ODT controller 20, and thus the descriptions thereof will be omitted.

In the above-described related art, upon adjustment of the first code Pcode<0:N> and the second code Ncode<0:N>, when the first line voltage P_out and the second line voltage N_out are larger than the reference voltage Vref, the resistance values need to be increased. To this end, the value of the first code Pcode<0:N> is increased and the value of the second code Ncode<0:N> is decreased.

At this time, when the impedance of the outside of the memory, that is, the impedance on input/output terminals of the semiconductor memory apparatus is very high, and the line voltage is continuously higher than the reference voltage, the value of the first code Pcode<0:N> is continuously increased and finally becomes a maximum, and thus the resistance value substantially approaches an infinite value. Similarly, the second code Ncode<0:N> is continuously decreased and finally becomes a minimum, and thus the resistance value substantially approaches an infinite value.

Accordingly, in the on-die termination circuit for a semiconductor memory apparatus according to the related art, code adjustment errors, that is, the maximum first code Pcode<0:N> and the minimum second code Ncode<0:N>, occur due to external impedance. Accordingly, the resistance values approach infinite values, and accurate data input/output is not performed.

SUMMARY OF THE INVENTION

Embodiments of the present invention have been made in order to solve the problems inherent in the related art, and embodiments of the present invention provide an on-die termination circuit and an on-die termination method for a semiconductor memory apparatus that can prevent code adjustment errors.

According to an embodiment of the present invention, an on-die termination circuit for semiconductor memory apparatus includes a driving unit that receives a code having at least two bits, divides an input voltage on the basis of a resistance ratio according to the code, and outputs the divided voltage, and an on-die termination control unit that counts the code or resets the code to an initial value according to whether or not a line voltage according to the resistance ratio of the driving unit and a resistance ratio of an external resistor unit are consistent with a reference voltage.

According to an embodiment of the present invention, there is provided an on-die termination method for a semiconductor memory apparatus, which includes an external resistor and a driving unit having a resistance ratio determined according to a code having at least two bits. The on-die termination method includes comparing a line voltage output according to a resistance ratio of the external resistor and the resistance ratio of the driving unit and a reference voltage, and counting the code or resetting the code to an initial value according to the comparison result.

According to another embodiment of the present invention, an on-die termination circuit for a semiconductor memory apparatus includes an ODT (On Die Termination) input driving unit that divides an input voltage on the basis of a resistance ratio according to a first code Pcode<0:N> having at least two bits and outputs a first line voltage, a first ODT control unit that counts the first code Pcode<0:N> or resets the first code Pcode<0:N> to a first set value according to whether or not the first line voltage and a reference voltage match with each other, an ODT output driving unit that divides an input voltage on the basis of the resistance ratio according to the first code Pcode<0:N> and a resistance ratio according to a second code Ncode<0:N> having at least two bits and outputs a second line voltage, and a second ODT control unit that counts the second code Ncode<0:N> or resets the second code Ncode<0:N> to a second set value according to whether or not the second line voltage and the reference voltage match with each other.

According to another embodiment of the present invention, there is provided an on-die termination method for a semiconductor memory apparatus, which has an input driving unit having a resistance ratio determined according to a first code Pcode<0:N>, and an output driving unit having a resistance ratio determined according to a second code Ncode<0:N>. The on-die termination method includes comparing a first line voltage output from the input driving unit and a reference voltage, counting the first code Pcode<0:N> or resetting the first code Pcode<0:N> to a first set value according to the result of the comparison, comparing a second line voltage output from the output driving unit and the reference voltage, and counting the second code Ncode<0:N> or resetting the second code Ncode<0:N> to a second set value according to the result of the secondary comparison.

DESCRIPTION OF EXEMPLARY EMBODIMENT

Hereinafter, exemplary embodiments of an on-die termination circuit and an on-die termination method for a semiconductor memory apparatus will be described with reference to the accompanying drawings.

First Embodiment

Figure 2:
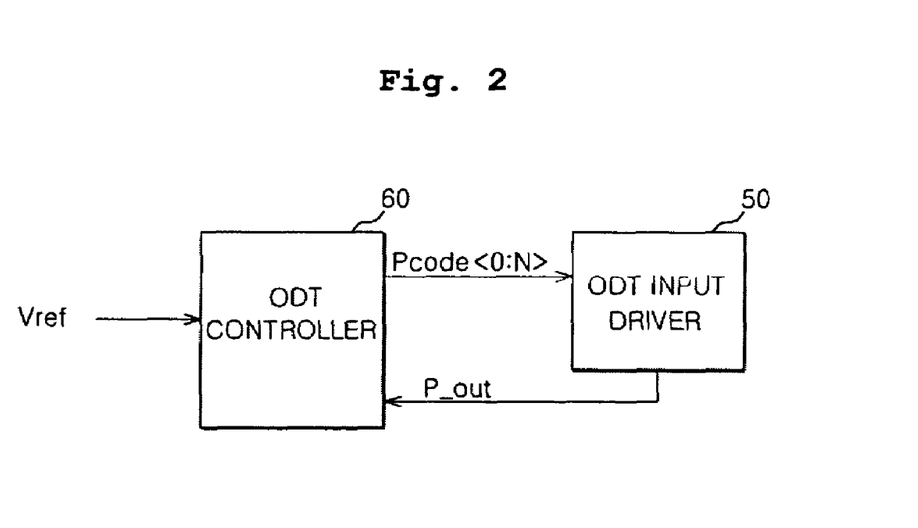
FIG. 2 is a block diagram showing the configuration of an on-die termination circuit for a semiconductor memory apparatus according to a first embodiment of the present invention.

As shown in FIG. 2, an on-die termination circuit for a semiconductor memory apparatus according to an embodiment the present invention includes an ODT input driver 50 that receives a code Pcode<0:N> having at least two bits, divides an input voltage on the basis of a resistance ratio according to the code Pcode<0:N>, and outputs the divided voltage, and an ODT controller 60 that counts the code Pcode<0:N> or resets the code Pcode<0:N> to an initial value based on whether or not a line voltage P_out according to a resistance ratio of the ODT input driver 50 and a resistance ratio of an external resistor ZQ is consistent with a reference voltage Vref.

Figure 3:
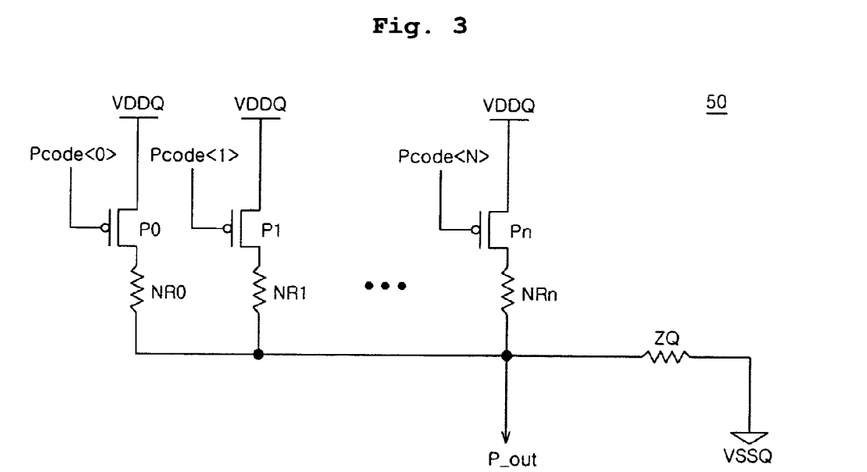
FIG. 3 is a circuit diagram showing the configuration of an ODT input driver shown in FIG. 2.

As shown in FIG. 3, the ODT input driver 50 includes a plurality of transistors P0 to Pn that are coupled to a power supply terminal VDDQ and are turned on according to the code Pcode<0:N>, and a plurality of resistors NR0 to NRn that are respectively coupled between the plurality of transistors P0 to Pn and a ground terminal VSSQ.

Figure 4:
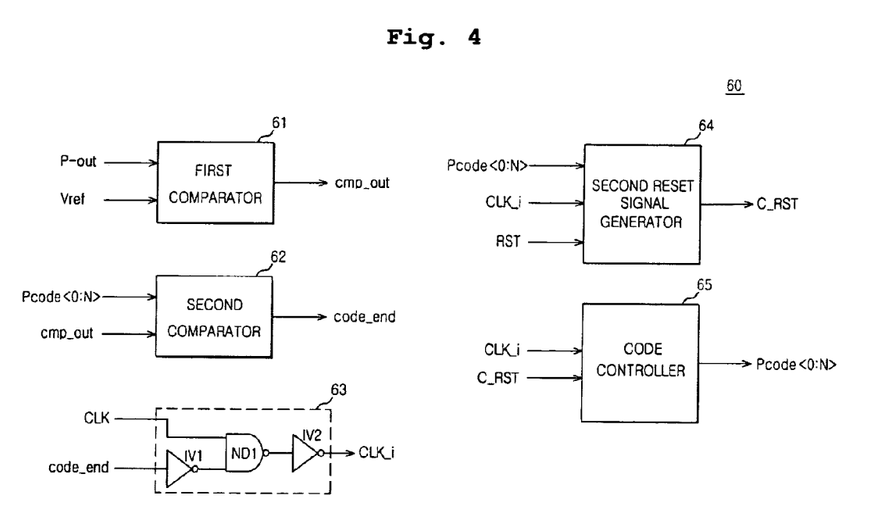
FIG. 4 is a block diagram showing the configuration of an ODT controller shown in FIG. 2.

As shown in FIG. 4, the ODT controller 60 includes a first comparator 61 that compares a line voltage P_out and a reference voltage Vref and outputs a comparison result signal cmp_out according to the comparison result, a second comparator 62 that outputs a code count end signal code_end according to the code Pcode<0:N> and the comparison result signal cmp_out, an internal clock generator 63 that generates an internal clock CLK_i according to an external clock CLK and the code count end signal code_end, a second reset signal generator 64 that generates a second reset signal C_RST according to the code Pcode<0:N> and the internal clock CLK_i and a reset signal RST, and a code controller 65 that counts or resets the code Pcode<0:N> according to the internal clock CLK_i and the second reset signal C_RST.

The first comparator 61 is configured to enable the comparison result signal cmp_out, for example, to a high level, when the line voltage P_out and the reference voltage Vref are consistent with each other.

The second comparator 62 is configured to enable the code count end signal code_end, for example, to a high level, when the code Pcode<0:N> reaches a set value in a state where the comparison result signal cmp_out is enabled or the comparison result signal cmp_out is disabled.

The set value may be at least one of the maximum and the minimum of the code Pcode<0:N>. The maximum corresponds to a case where all bits are "1" (high), and the minimum corresponds to a case where all bits are "0" (low).

The internal clock generator 63 includes a first inverter IV1 that receives the code count end signal code_end, a first NAND gate ND1 that receives an output of the first inverter IV1 and the external clock CLK, and a second inverter IV2 that receives an output of the first NAND gate ND1 and outputs the internal clock CLK_i.

The second reset signal generator 64 includes a logical circuit which enables the second reset signal C_RST when all bits of the code Pcode<0:N> have the same value or the reset signal RST is enabled.

Figure 5:
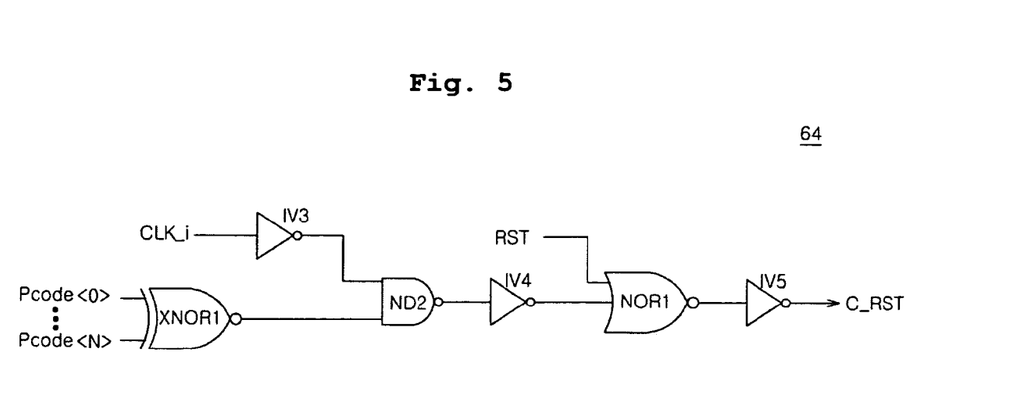
FIG. 5 is a circuit diagram showing the configuration of a second reset signal generator shown in FIG. 4.

As shown in FIG. 5, the logical circuit of the second reset signal generator 64 may include an XNOR gate XNOR1 that receives the code Pcode<0:N>, a third inverter IV3 that receives the internal clock CLK_i, a second NAND gate ND2 that receives an output of the XNOR gate XNOR1 and an output of the third inverter IV3, a fourth inverter IV4 that receives an output of the second NAND gate ND2, a NOR gate NOR1 that receives an output of the fourth inverter IV4 and the reset signal RST, and a fifth inverter IV5 that receives an output of the NOR gate NOR1 and outputs the second reset signal C_RST.

The code controller 65 has a register that sequentially counts the code Pcode<0:N> according to the internal clock CLK_i, and resets the code Pcode<0:N> to an initial code according to the second reset signal C_RST.

The operation of the on-die termination circuit for a semiconductor memory apparatus according to the first embodiment of the present invention having the above-described configuration will now be described.

First, upon initial operation, the ODT controller 60 outputs a preset initial code Pcode<0:N> to the ODT input driver 50.

Then, the line voltage P_out that is obtained by dividing a power supply voltage VDDQ on the basis of a resistance ratio of resistors connected according to the initial code Pcode<0:

N> in the ODT input driver 50 and a resistance ratio of the external resistor ZQ is input to the ODT controller 60.

Figure 6:
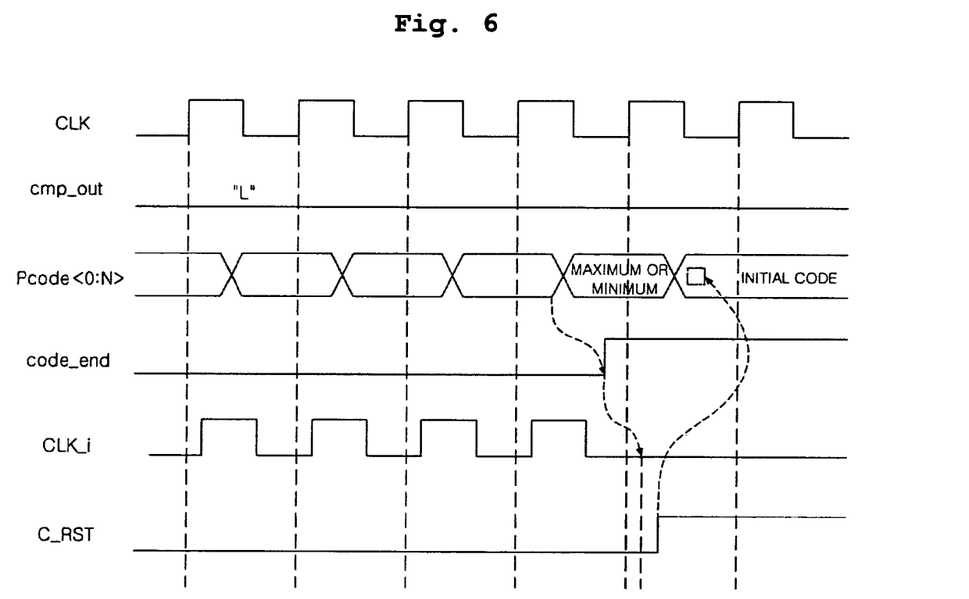
FIG. 6 is a timing chart showing signal waveforms of individual parts according to the first embodiment of the present invention.

Next, the first comparator 61 shown in FIG. 4 compares the line voltage P_out and the reference voltage Vref and, when they are inconsistent with each other, outputs the comparison result signal cmp_out at a low level, as shown in FIG. 6.

Next, the second comparator 62 shown in FIG. 4 disables the code count end signal code_end to the low level when the code Pcode<0:N> does not reach the set value in a state where the comparison result signal cmp_out is disabled, as shown in FIG. 6.

Next, the internal clock generator 63 shown in FIG. 4 outputs the external clock CLK, which is delayed by the first NAND gate ND1 and the second inverter IV2, as the internal clock CLK_i to the code controller 65 in a state where the code count end signal code_end is disabled (low level), as shown in FIG. 6.

Next, the second reset signal generator 64 shown in FIG. 5 enables the second reset signal C_RST when all bits of the code Pcode<0:N> have the same value (all bits are high or low) and the internal clock CLK_i is at the low level or when the reset signal RST is enabled.

However, when the code Pcode<0:N> does not reach the maximum (when the number of bits of the code Pcode<0:N> is 4, for example, 1111) or the minimum (when the number of bits of the code Pcode<0:N> is 4, for example, 0000), all bits of the code Pcode<0:N> do not have the same value. In this case, the second reset signal generator 64 shown in FIG. 5 keeps the second reset signal C_RST in a disable state, as shown in FIG. 6.

Accordingly, the code controller 65 shown in FIG. 4 sequentially counts the code Pcode<0:N> according to the internal clock CLK_i in a state where the second reset signal C_RST is disabled, as shown in FIG. 6.

At this time, the line voltage P_out according to a resistance ratio of the ODT input driver 50 determined by sequentially counting the code Pcode<0:N> and a resistance ratio of the external resistor ZQ (FIG. 3) is continuously fed back to the first comparator 61 shown in FIG. 4. Next, the internal clock CLK_i generated by the operations of the first comparator 61, the second comparator 62, and the internal clock generator 63 shown in FIG. 4 is supplied to the code controller 65.

Meanwhile, even though the comparison result signal cmp_out from the first comparator 61 shown in FIG. 4 is disabled to the low level, if the code Pcode<0:N> to be sequentially counted reaches the maximum or the minimum, the second comparator 62 shown in FIG. 4 enables the code count end signal code_end to the high level, as shown in FIG. 6.

Next, as the code count end signal code_end is enabled to the high level, the internal clock generator 63 shown in FIG. 4 keeps the internal clock CLK_i at the low level and stops the generation of the pulse, as shown in FIG. 6.

Further, when the code Pcode<0:N> reaches the maximum or the minimum and then all bits have the same value, and when the internal clock CLK_i is at the low level, the second reset signal generator 64 enables the second reset signal C_RST to the high level, as shown in FIG. 6.

Therefore, since the internal clock CLK_i is not supplied, the code controller 65 stops to count the code Pcode<0:N>. Further, when the second reset signal C_RST is enabled, the code controller 65 resets the currently counted code Pcode<0:N> to the initial code Pcode<0:N>.

Second Embodiment

Figure 7:
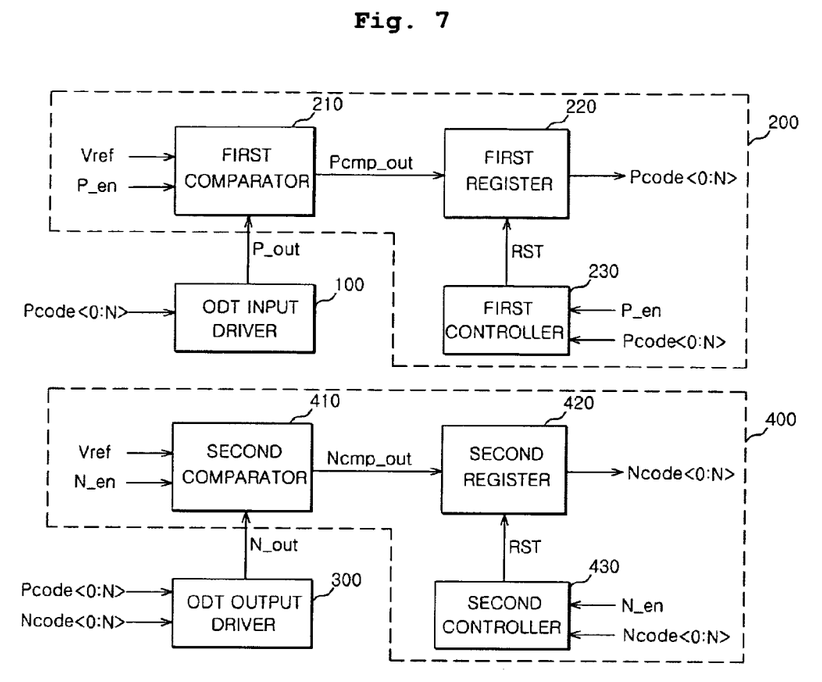
FIG. 7 is a block diagram showing the configuration of an on-die termination circuit for a semiconductor memory apparatus according to a second embodiment of the present invention.

As shown in FIG. 7, an on-die termination circuit for a semiconductor memory apparatus according to a second embodiment of the present invention includes an ODT (On Die Termination) input driver 100 that divides an input voltage on the basis of a resistance ratio according to a first code Pcode<0:N> having at least two bits and outputs a first line voltage P_out, a first ODT controller 200 that counts the first code Pcode<0:N> or resets the first code Pcode<0:N> to a first set value according to whether or not the first line voltage P_out and a reference voltage Vref are consistent with each other, an ODT output driver 300 that divides the input voltage on the basis of the resistance ratio of the first code Pcode<0.0:N> and the resistance ratio of second code Ncode<0:N> and outputs a second line voltage N_out, and a second ODT controller 400 that counts the second code Ncode<0:N> or resets the second code Ncode<0:N> to a second set value according to whether or not the second line voltage N_out and the reference voltage Vref are consistent with each other.

The first ODT controller 200 includes a first comparator 210 that compares the first line voltage P_out and the reference voltage Vref according to a first enable signal P_en and outputs a first comparison result signal Pcmp_out, a first register 220 that counts the first code Pcode<0:N> or resets the first code Pcode<0:N> to the first set value according to the first comparison result signal Pcmp_out and a reset signal RST, and a first controller 230 that generates the reset signal RST according to the first enable signal P_en and the first code Pcode<0:N>.

The second ODT controller 400 includes a second comparator 410 that compares the second line voltage N_out and the reference voltage Vref according to a second enable signal N_en and outputs a second comparison result signal Ncmp_out, a second register 420 that counts the second code Ncode<0:N> or resets the second code Ncode<0:N> to the second set value according to the second comparison result signal Ncmp_out and the reset signal RST, and a second controller 430 that generates the reset signal RST according to the second enable signal N_en and the second code Ncode<0:N>.

Figure 8:
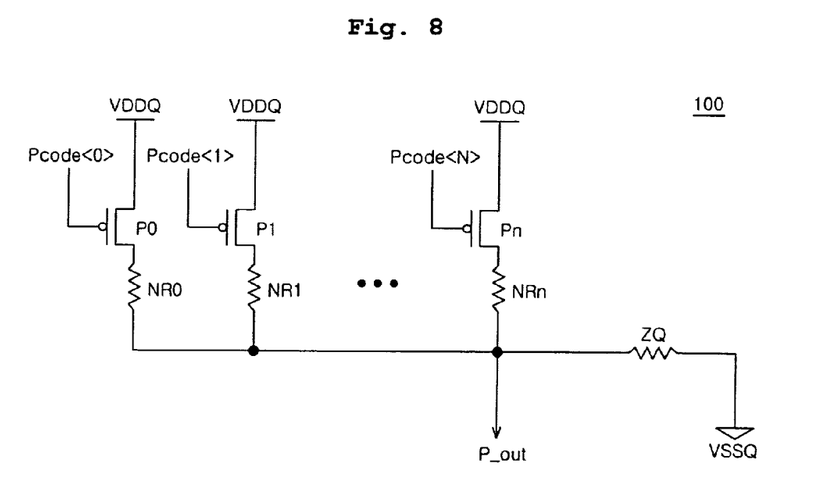
FIG. 8 is a circuit diagram showing the configuration of an ODT input driver shown in FIG. 7.

As shown in FIG. 8, the ODT input driver 100 includes a plurality of transistors P0 to Pn that are coupled to a power supply terminal VDDQ and are turned on according to the first code Pcode<0:N>, and a plurality of resistors NR0 to NRn that are respectively coupled between the plurality of transistors P0 to Pn and a ground terminal VSSQ.

Figure 9:
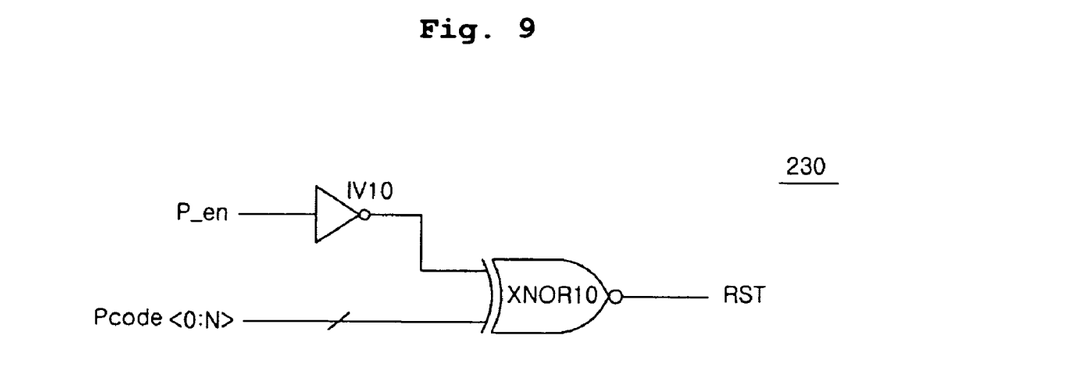
FIG. 9 is a circuit diagram showing the configuration of a first controller shown in FIG. 7.

The first controller 230 is configured to enable the reset signal RST when the first code Pcode<0:N> reaches the maximum (for example, when N in Pcode<0:N> is 4, that is, Pcode<0:N> has five bits, 11111) in a state where the first enable signal P_en is disabled. As shown in FIG. 9, the first controller 230 includes a first inverter IV10 that receives the first enable signal P_en, and a first XNOR gate XNOR10 that receives an output of the first inverter IV10 and the first code Pcode<0:N>.

Figure 10:
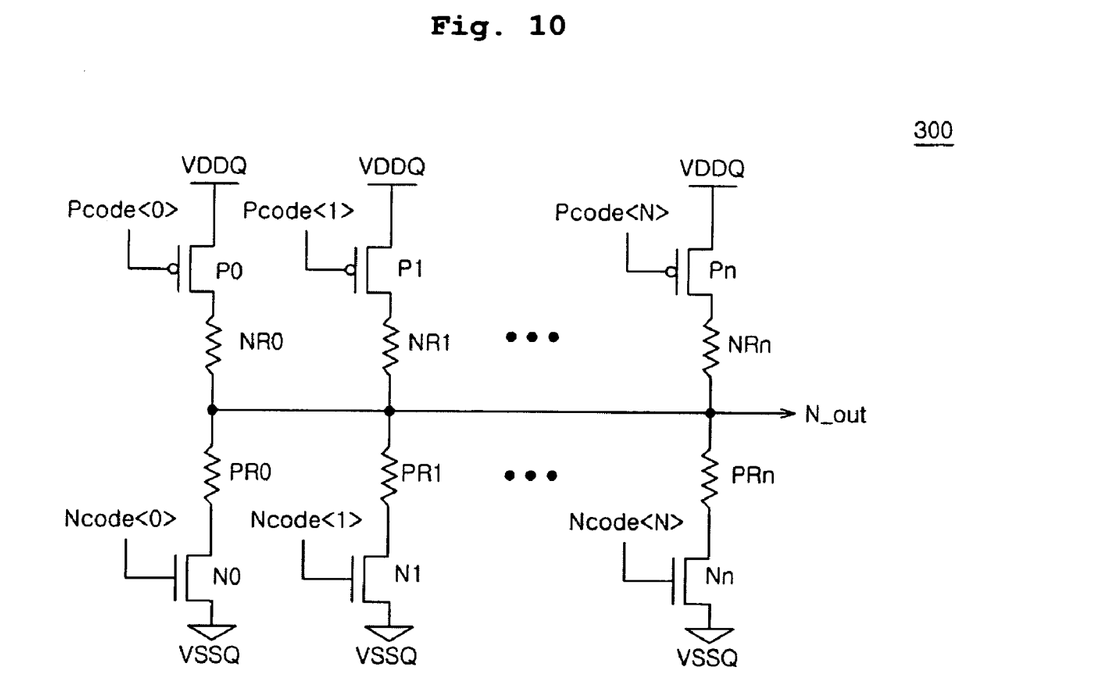
FIG. 10 is a circuit diagram showing the configuration of an ODT output driver shown in FIG. 7.

As shown in FIG. 10, the ODT output driver 300 includes a plurality of transistors P0 to Pn that are coupled to the power supply terminal VDDQ and are turned on according to the first code Pcode<0:N>, a plurality of resistors NR0 to NRn that are respectively coupled to the plurality of transistors P0 to Pn, a plurality of resistors PR0 to PRn that are respectively coupled to the plurality of resistors NR0 to NRn, a plurality of transistors N0 to Nn that are respectively coupled between the plurality of resistors PR0 to PRn and the ground terminal VSSQ and are turned on according to the second code Ncode<0:N>.

Figure 11:
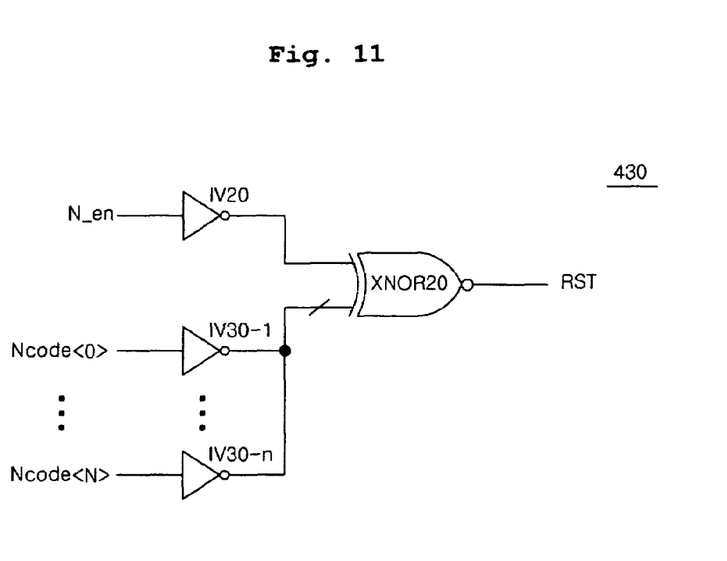
FIG. 11 is a circuit diagram showing the configuration of a second controller shown in FIG. 7.

The second controller 430 is configured to enable the reset signal RST when the second code Ncode<0:N> reaches the minimum (for example, when Ncode<0:N> has five bits, 00000) in a state where the second enable signal N_en is disabled. As shown in FIG. 11, the second controller 430 includes a second inverter IV20 that receives the second enable signal N_en, third inverters IV30-1 to IV30-n that respectively receive the bits of the second code Ncode<0:N>, the number of third inverters corresponding to the number of bits of the second code Ncode<0:N>, and a second XNOR gate XNOR20 that receives the outputs of the third inverters IV30-1 to IV30-n and the output of the second inverter IV20.

The operation of the on-die termination circuit a for semiconductor memory apparatus according to the second embodiment of the present invention having the above-described configuration will now be described.

First, the operation related to a first code Pcode<0:N> adjustment will be described.

Upon initial operation, an initial first code Pcode<0:N> preset in the first register 220 is input to the ODT input driver 100.

Then, the ODT input driver 100 outputs the first line voltage P_out on the basis of a resistance ratio of resistors connected according to the first code Pcode<0:N> and a resistance ratio of the external resistor ZQ.

Next, the first comparator 210 compares the first line voltage P_out and the reference voltage Vref according to the first enable signal P_en and outputs the first comparison result signal Pcmp_out according to the comparison result.

Figure 12:
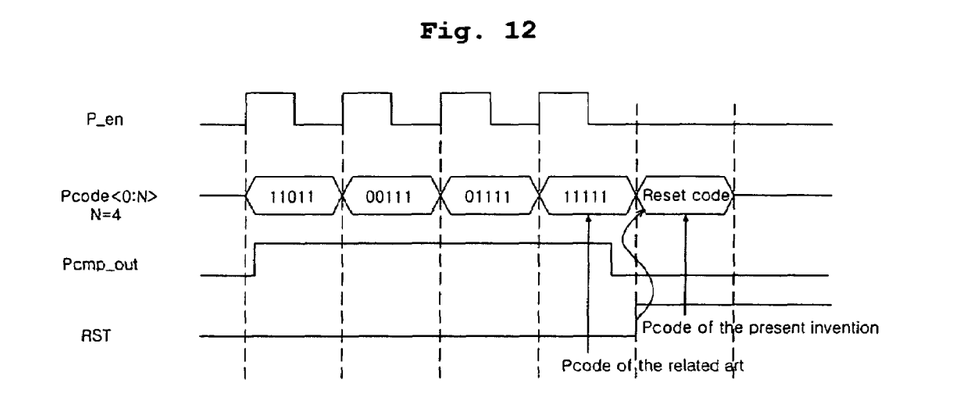
FIG. 12 is a timing chart showing signal waveforms related to a first code Pcode<0:N> adjustment according to the second embodiment of the present invention.

At this time, if the first line voltage P_out is inconsistent with the reference voltage Vref, as shown in FIG. 12, the first comparator 210 outputs the first comparison result signal Pcmp_out at a high level to allow the first register 220 to perform an up-count.

Then, the first register 220 up-counts the first code Pcode<0:N> according to the first comparison result signal Pcmp_out, as shown in FIG. 12.

At this time, the ODT input driver 100 feeds back the first line voltage P_out according to the up-counted first code Pcode<0:N> to the first comparator 210, and then the first comparator 210 repeats the above-described comparison operation and the output operation of the first comparison result signal Pcmp_out according to the comparison operation.

In a state in which the first enable signal P_en is enabled, that is, when the pulse is generated, if the first line voltage P_out and the reference voltage Vref are consistent with each other, the first comparator 210 outputs the first comparison result signal Pcmp_out at a low level. Then, the count operation of the first register 220 stops, and the ODT operation is completed.

However, as shown FIG. 12, even though the up-count of the first code Pcode<0:N> is continuously performed in a state where the first enable signal P_en is enabled, since the first line voltage P_out and the reference voltage Vref are inconsistent with each other, the first comparison result signal Pcmp_out maintains a high level. Then, the first code Pcode<0:N> reaches the maximum (11111), and the first enable signal P_en is disabled.

Accordingly, the first controller 230 shown in FIG. 9 receives the first code Pcode<0:N> reaching the maximum (11111) and the first enable signal P_en disabled to the low level, and enables the reset signal RST to the high level.

Then, the first register 220 resets the first code Pcode<0:N> to the first set value according to the reset signal RST and stores the reset first code Pcode<0:N>.

Therefore, the impedance on an input/output side of the semiconductor memory apparatus is very high, and thus a code adjustment error whereby the first code Pcode<0:N> is stored as the maximum is prevented.

Next, the operation related to a second code Ncode<0:N> adjustment will be described.

Upon initial operation, an initial second code Pcode<0:N> preset in the second register 420 is input to the ODT output driver 300.

Then, the ODT output driver 300 outputs the second line voltage N_out on the basis of a resistance ratio of resistors connected according to the second code Ncode<0:N>.

Next, the second comparator 410 compares the second line voltage N_out and the reference voltage Vref according to the second enable signal N_en, and outputs the second comparison result signal Ncmp_out according to the comparison result.

Figure 13:
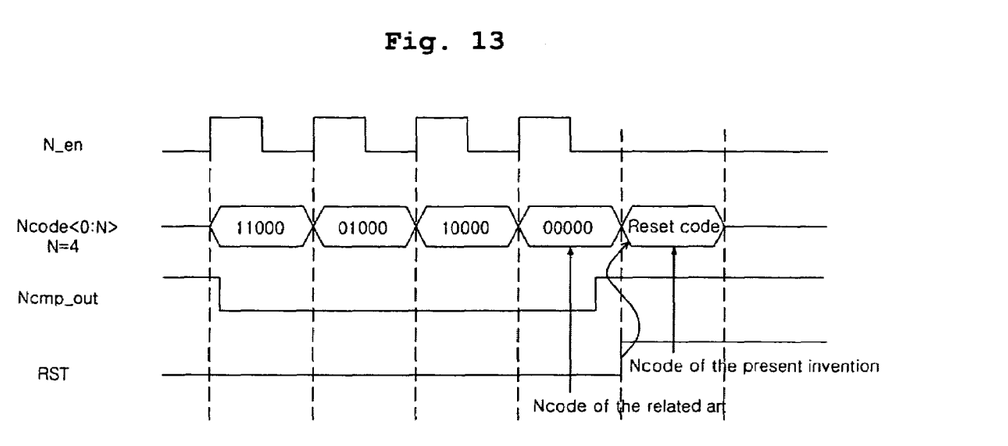
FIG. 13 is a timing chart showing signal waveforms related to a second code Ncode<0:N> adjustment according to the second embodiment of the present invention.

When the second line voltage N_out is inconsistent with the reference voltage Vref, the second comparator 410 outputs the second comparison result signal Ncmp_out at a low level to allow the second register 420 to perform a down-count, as shown in FIG. 13.

Then, the second register 420 down-counts the second code Ncode<0:N> according to the second comparison result signal Ncmp_out, as shown in FIG. 13.

At this time, the ODT output driver 300 feeds back the second line voltage N_out according to the down-counted second code Ncode<0:N> to the second comparator 410, and then the second comparator 410 repeats the above-described comparison operation and the output operation of the second comparison result signal Ncmp_out according to the comparison operation.

In a state where the second enable signal N_en is enabled, that is, when the pulse is generated, if the second line voltage N_out and the reference voltage Vref are consistent with each other, the second comparator 410 outputs the second comparison result signal Ncmp_out at a high level. Then, the count operation of the second register 420 stops, and the ODT operation is completed.

However, as shown in FIG. 13, even though the down-count of the second code Ncode<0:N> is continuously performed in a state where the second enable signal N_en is enabled, since the second line voltage N_out and the reference voltage Vref are inconsistent with each other, the second comparison result signal Ncmp_out maintains a low level. Then, the second code Ncode<0:N> reaches the minimum (00000), and the second enable signal N_en is disabled.

Accordingly, the second controller 430 shown in FIG. 11 receives the second code Ncode<0:N> reaching the minimum (00000) and the second enable signal N_en disabled to the low level, and enables the reset signal RST to the high level.

Then, the second register 420 resets the second code Ncode<0:N> to the second set value according to the reset signal RST and stores the reset second code Ncode<0:N>.

Therefore, the impedance on an input/output side of the semiconductor memory apparatus is very high, and thus a code adjustment error whereby the second code Ncode<0:N> is stored as the minimum is prevented.

At this time, the first set value related to the first code Pcode<0:N> and the second set value related to the second code Ncode<0:N> are set through simulations or operational tests of the semiconductor memory apparatus, or set to the initial value of code such that, even though the impedance on an input/output side of the semiconductor memory apparatus is high, data input/output can be performed.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The on-die termination circuit and method for semiconductor memory apparatus according to embodiments of the present invention prevent code value adjustment errors so as to allow normal data input and output. Therefore, reliability of the memory operations can be improved.

What is claimed is:

1. An on-die termination circuit for a semiconductor memory apparatus, comprising:
   a driving unit configured to receive a code having at least two bits, divide an input voltage on the basis of a resistance ratio of the driving unit according to the code, and output the divided voltage; and
   an on-die termination control unit configured to count the code based on whether or not line voltages according to the resistance ratio of the driving unit and a resistance of an external resistor unit correspond with a reference voltage, and to reset the code to a predetermined initial value when the counting of the code is stopped and a value of the code is a set value, wherein the on-die termination control unit includes:
   a first comparator configured to compare the line voltage with the reference voltage and output a comparison result signal,
   a second comparator configured to output a code count end signal according to the code and the comparison result signal,
   an internal clock generated configured to generate an internal clock according to an external clock and the code count end signal,
   a second reset signal generator configured to generate a second reset signal according to the code, the internal clock, and reset signal, and
   a code controller configured to count or reset the code according to the internal clock and the second reset signal.

2. The on-die termination circuit of claim 1, wherein the driving unit includes:
   a plurality of switching elements coupled to a power supply terminal and that are turned on according to the code, and
   a plurality of resistors, respective resistors coupled between respective ones of the plurality of switching elements and a ground terminal VSSQ.

3. The on-die termination circuit of claim 1, wherein the first comparator is configured to enable the comparison result signal when the line voltage and the reference voltage are consistent with each other.

4. The on-die termination circuit of claim 1, wherein the second comparator is configured to enable the code count end signal when the comparison result signal is enabled, and the code reaches a set value in a state where the comparison result signal is disabled.

5. The on-die termination circuit of claim 1, wherein the internal clock generator includes:
   a first inverter configured to receive the code count end signal and produce an output based thereon,
   a NAND gate configured to receive the output of the first inverter and the external clock and produce an output based thereon, and
   a second inverter configured to receive the output of the NAND gate and output the internal clock.

6. The on-die termination circuit of claim 1, wherein the second reset signal generator is configured to enable the second reset signal when all bits of the code have the same value or when the reset signal is enabled.

7. The on-die termination circuit of claim 1, wherein the second reset signal generator includes:
   a XNOR gate configured to receive the code and produce an output based thereon,
   a first inverter configured to receive the internal clock and produce an output based thereon,
   a NAND gate configured to receive the output of the XNOR gate and the output of the first inverter and produce an output based thereon,
   a second inverter configured to receive the output of the first NAND gate and produce an output based thereon,
   a NOR gate configured to receive the output of the second inverter and the reset signal and produce an output based thereon, and
   a third inverter configured to receive the output of the NOR gate and output the second reset signal.

8. The on-die termination circuit of claim 1, wherein the code controller comprises a register configured to count the code according to the internal clock and reset the code according to the second reset signal.

9. The on-die termination circuit of claim 1, wherein the on-die termination control unit is provided with a clock signal for to count the code, and the on-die termination control unit stops the counting of the code when the clock signal is no longer inputted.

10. An on-die termination circuit for a semiconductor memory apparatus, comprising:
   an ODT (On Die Termination) input driving unit configured to divide an input voltage on the basis of a resistance ratio according to a first code having at least two bits and output a first line voltage;
   a first ODT control unit configured to count the first code according to whether or not the first line voltage and a reference voltage correspond with each other and to reset a value of the first code to a predetermined first set value when the counting of the first code is stopped and the value of the first code is a maximum or minimum value;
   an ODT output driving unit configured to divide an input voltage on the basis of the resistance ratio according to the first code and a second code having at least two bits and output a second line voltage; and
   a second ODT control unit configured to count the second code according to whether or not the second line voltage and the reference voltage match with each other and to reset a value of the second code to a predetermined second set value when the counting of the second code is stopped and a value of the second code is a minimum or maximum value, wherein the first ODT control unit includes:
   a comparator configured to compare the first line voltage with the reference voltage according to a first enable signal and output a first comparison result signal,
   a register configured to count Pcode<0:N> or reset the first code Pcode<0:N> to the first set value according to the first comparison result signal and a reset signal, and a controller configured to generate the reset signal according to the first enable signal and the first code.

11. The on-die termination circuit of claim 10, wherein the ODT input driving unit includes:
a plurality of switching elements coupled to a power supply terminal and that are turned on according to the first code, and
a plurality of resistors, respective resistors coupled between respective ones of the plurality of switching elements and a ground terminal VSSQ.

12. The on-die termination circuit of claim 10, wherein the comparator is configured to output the first comparison result signal to allow the register to perform an up-count when the first line voltage is inconsistent with the reference voltage.

13. The on-die termination circuit of claim 10, wherein the controller is configured to enable the reset signal when the first code reaches the maximum value in a state where the first enable signal is disabled.

14. The on-die termination circuit of claim 10, wherein the first enable signal comprises a pulse signal.

15. The on-die termination circuit of claim 10, wherein the controller includes:
an inverter configured to receive the first enable signal and produce an output based thereon, and
an XNOR gate configured to receive the output of the inverter and the first code.

16. The on-die termination circuit of claim 10, wherein the ODT output driving unit includes:
a first transistor group having a plurality of transistors coupled to a power supply terminal and that are turned on according to the second code,
a first resistor group having a plurality of resistors respectively coupled between the transistors of the first transistor group and a ground terminal,
a second resistor group having a plurality of resistors respectively coupled to the resistors of the first resistor group, and
a second transistor group having a plurality of transistors respectively coupled between the resistors of the second resistor group and the ground terminal and that are turned on according to the second code.

17. The on-die termination circuit of claim 10, wherein the second ODT control unit includes:
a comparator configured to compare the second line voltage and the reference voltage according to a second enable signal and output a second comparison result signal,
a register configured to count the second code or reset the second code to a second set value according to the second comparison result signal and a reset signal, and
a controller configured to generate a reset signal according to the second enable signal and the second code.

18. The on-die termination circuit of claim 17, wherein the comparator is configured to output the second comparison result signal to allow the register to perform a down-count when the second line voltage is inconsistent with the reference voltage.

19. The on-die termination circuit of claim 17, wherein the controller is configured to enable the reset signal when the second code reaches the minimum in a state where the second enable signal is disabled.

20. The on-die termination circuit of claim 17, wherein the second enable signal comprises a pulse signal.

21. The on-die termination circuit of claim 17, wherein the controller includes:
a first inverter configured to receive the second enable signal and produce an output based thereon,
second inverters configured to respectively receive bits of the second code, the number of second inverters corresponding to the number of bits of the second code, and to produce respective outputs based thereon, and
an XNOR gate that receives the outputs of the first inverter and second inverters.

22. The on-die termination circuit of claim 10, wherein the first set value and the second set value are set through simulations or operational tests of the semiconductor memory apparatus.

23. The on-die termination circuit of claim 10, wherein the first on-die termination control unit is provided with a first enable signal for determining a period of the counting of the first code, and the counting of the first code is stopped when the first enable signal is disabled.

24. The on-die termination circuit of claim 10, wherein the second on-die termination control unit is provided with a second enable signal for determining a period of the counting of the second code, and the counting of the code is stopped when the second enable signal is disabled.

* * * * *